(12) United States Patent
Lin et al.

(10) Patent No.: US 10,629,475 B2
(45) Date of Patent: Apr. 21, 2020

(54) SEMICONDUCTOR DEVICE WITH TWO-PART INSULATION STRUCTURE WITHIN NON-ACTIVE REGION

(71) Applicant: Vanguard International Semiconductor Corporation, Hsinchu (TW)

(72) Inventors: Hsin-Chih Lin, Hsinchu (TW); Shin-Cheng Lin, Tainan (TW); Yung-Hao Lin, Jhunan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/852,372

(22) Filed: Dec. 22, 2017

(65) Prior Publication Data
US 2019/0198384 A1  Jun. 27, 2019

(51) Int. Cl.
*H01L 21/762* (2006.01)
*H01L 29/20* (2006.01)
(Continued)

(52) U.S. Cl.
CPC .... *H01L 21/76237* (2013.01); *H01L 21/2654* (2013.01); *H01L 21/30621* (2013.01); *H01L 29/0653* (2013.01); *H01L 29/2003* (2013.01); *H01L 29/205* (2013.01); *H01L 29/66462* (2013.01); *H01L 29/7787* (2013.01);
(Continued)

(58) Field of Classification Search
CPC .......... H01L 21/76237; H01L 21/2654; H01L 21/30621; H01L 29/0653; H01L 29/2003; H01L 29/205; H01L 29/66462; H01L 29/7787; H01L 21/02378; H01L 21/02381; H01L 21/0242; H01L 21/02458; H01L 21/0254; H01L 21/0262
See application file for complete search history.

(56) References Cited

U.S. PATENT DOCUMENTS 10,373,833 B2 * 8/2019 Shindome ........... H01L 29/4236
2009/0065864 A1 * 3/2009 Lee ....................... H01L 21/743
257/343
(Continued)

FOREIGN PATENT DOCUMENTS

TW   200913267 A   3/2009

OTHER PUBLICATIONS

Office Action dated Sep. 15, 2017 of Taiwanese Patent Application No. 106124511.

*Primary Examiner* — Peter Bradford
(74) *Attorney, Agent, or Firm* — Birch, Stewart, Kolasch & Birch, LLP

(57) ABSTRACT

A method for forming a semiconductor device is provided. A substrate is provided. An epitaxial layer is formed on the substrate. An insulation region and an active region are defined on the upper surface of the epitaxial layer. An insulation structure is formed within the insulation region by an ion implantation process and an etching process, wherein the insulation structure includes a first insulation structure and a second insulation structure. A gate is formed on the epitaxial layer and is disposed within the active region. A source and a drain are formed on opposite sides of the gate and within the active region. A semiconductor device is also provided.

19 Claims, 8 Drawing Sheets

(51) Int. Cl.
*H01L 29/205* (2006.01)
*H01L 29/06* (2006.01)
*H01L 29/778* (2006.01)
*H01L 21/265* (2006.01)
*H01L 29/66* (2006.01)
*H01L 21/306* (2006.01)
*H01L 21/02* (2006.01)

(52) U.S. Cl.
CPC ...... *H01L 21/0242* (2013.01); *H01L 21/0254* (2013.01); *H01L 21/0262* (2013.01); *H01L 21/02378* (2013.01); *H01L 21/02381* (2013.01); *H01L 21/02458* (2013.01); *H01L 21/02502* (2013.01)

(56) References Cited

U.S. PATENT DOCUMENTS

| | | | |
|---|---|---|---|
| 2012/0153300 A1* | 6/2012 | Lidow | H01L 21/743 257/77 |
| 2014/0131720 A1* | 5/2014 | Hsiung | H01L 29/4236 257/76 |
| 2016/0133698 A1* | 5/2016 | Chou | H01L 21/76224 257/506 |
| 2018/0033631 A1* | 2/2018 | Bera | H01L 29/404 |

* cited by examiner

SEMICONDUCTOR DEVICE WITH TWO-PART INSULATION STRUCTURE WITHIN NON-ACTIVE REGION

BACKGROUND OF THE INVENTION

Field of the Invention

The present invention relates to a semiconductor device, and in particular it relates to a semiconductor device which is able to suppress the gate leakage current, and to a method for forming the same.

Description of the Related Art

In the semiconductor industry, gallium nitride (GaN) is usually used to form various integrated circuit components, such as high electron mobility transistor (HEMT) elements. The different materials of the adjacent nitride layers in the gallium nitride semiconductor device cause the adjacent nitride layers to have different band gaps. The band gap discontinuity and piezo-electric effect create a carrier channel with highly mobile conducting electrons around the interface of the adjacent nitride gallium layers. The carrier channel is referred to as a two-dimensional electron gas (2-DEG). The 2-DEG is used as an element channel in the gallium nitride semiconductor device.

However, since the integrated circuit (IC) is constituted by devices arranged adjacent to each other, if there is no electrical insulation, the devices will interfere with each other, so that the integrated circuit cannot function properly. Therefore, insulation processes are required in the two-dimensional direction to block conduction between adjacent elements. There are some drawbacks in the insulation processes currently used. For example, an isolation effect may be provided by cutting off materials using an etching process, but materials will be damaged and an additional leakage current path will be generated. The material damage and the generation of the additional leakage current path may be avoided by forming an insulation region through an ion implantation, but the formed insulation region is sensitive to temperature. The higher the temperature, the worse the isolation effect.

Therefore, in this technical field, a novel isolation process for providing a good isolation effect between the semiconductor devices and blocking conduction between adjacent elements is desirable.

BRIEF SUMMARY OF THE INVENTION

In one embodiment of the present disclosure, a method for forming a semiconductor device is provided. In an exemplary embodiment of the method for forming a semiconductor device, a substrate is provided. An epitaxial layer is formed on the substrate. An insulation region and an active region are defined on the upper surface of the epitaxial layer. An insulation structure is formed within the insulation region by an ion implantation process and an etching process, wherein the insulation structure includes a first insulation structure and a second insulation structure. A gate is formed on the epitaxial layer and is disposed within the active region. A source and a drain are formed on opposite two sides of the gate and are disposed within the active region.

In another embodiment of the present disclosure, a semiconductor device is provided. The semiconductor device includes a substrate. An epitaxial layer is disposed on the substrate, and the epitaxial layer has an insulation region and an active region. An insulation structure, including a first insulation structure and a second insulation structure, is disposed within the insulation region. A gate is disposed on the epitaxial layer and within the active region. A source and a drain are disposed on opposite sides of the gate and within the active region. The first insulation structure and the second insulation structure are different from each other in composition.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
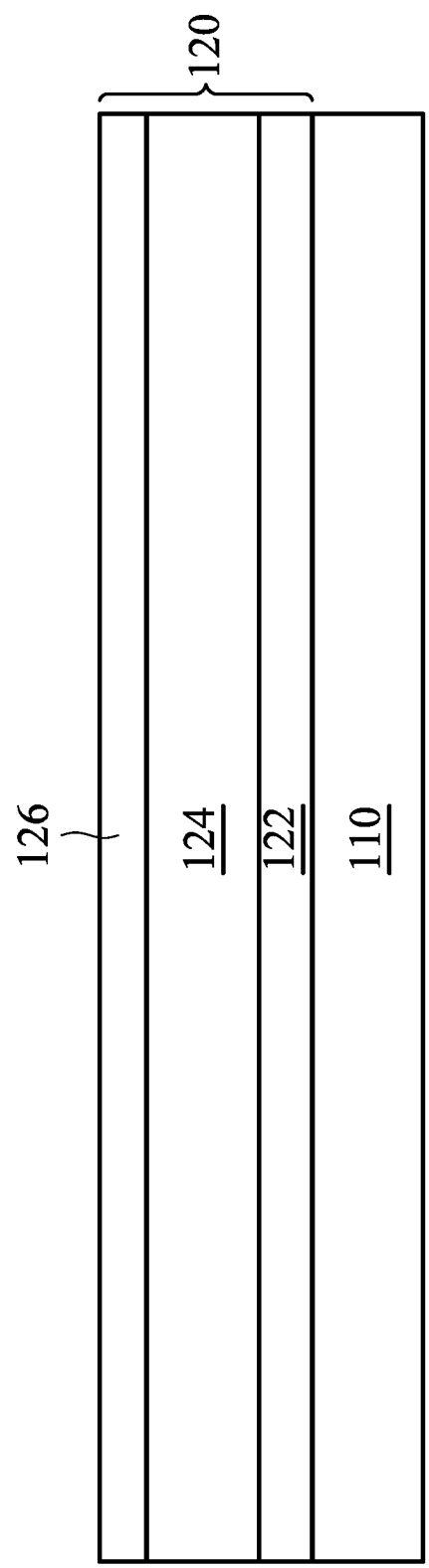
FIG. 1A shows a cross-sectional view of a semiconductor device at various manufacturing stages according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is noted that, in accordance with the standard practice in the industry, various features are not drawn to scale. In fact, the dimensions of the various features may be arbitrarily increased or reduced for clarity of discussion.

As used herein, the singular forms "a," "an" and "the" are intended to include the plural forms as well, unless the context clearly indicates otherwise. It will be further understood that the terms "comprises" and/or "comprising,"— when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the present disclosure provide a semiconductor device which is capable of blocking conduction between adjacent elements and a method for forming the same. Compared to the current technology, by providing an improvement of the process, the present disclosure forms an insulation region with a good isolation effect in a semiconductor device by using a double insulation process, thereby blocking conduction between adjacent elements. Embodiments of the present disclosure provide a semiconductor device and a method for forming the same. In some embodiments the present disclosure, the aforementioned semiconductor device is a gallium nitride high electron mobility transistor (HEMT) element.

Figure 1B:
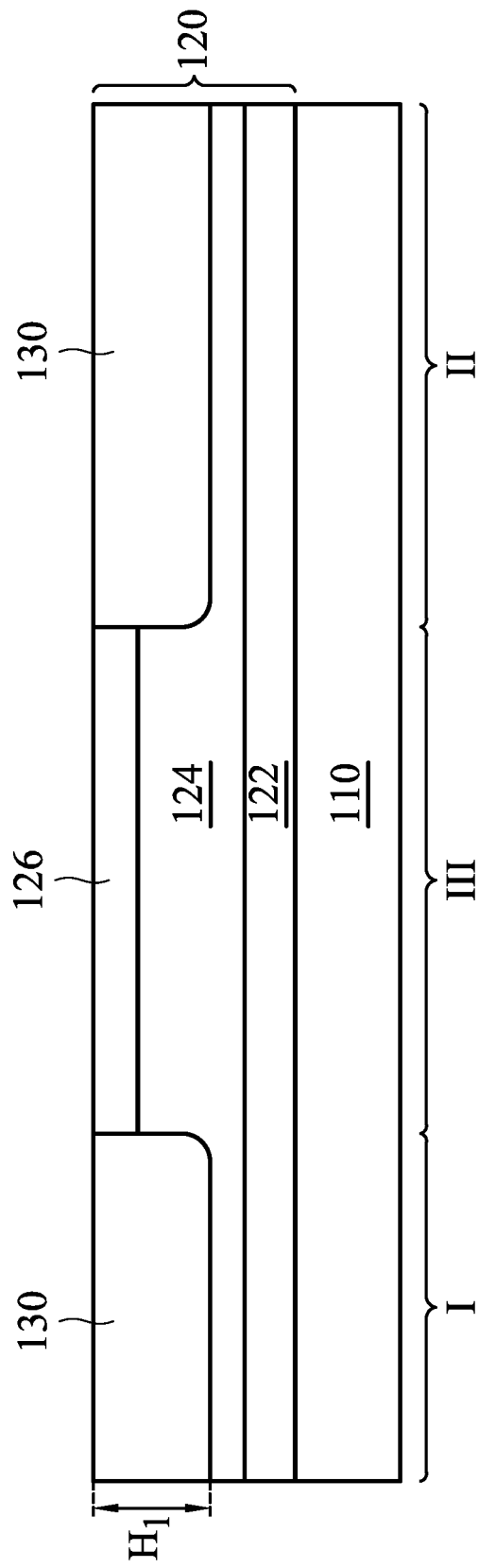
FIG. 1B shows a cross-sectional view of a semiconductor device at various manufacturing stages according to some embodiments of the present disclosure.
Figure 1C:
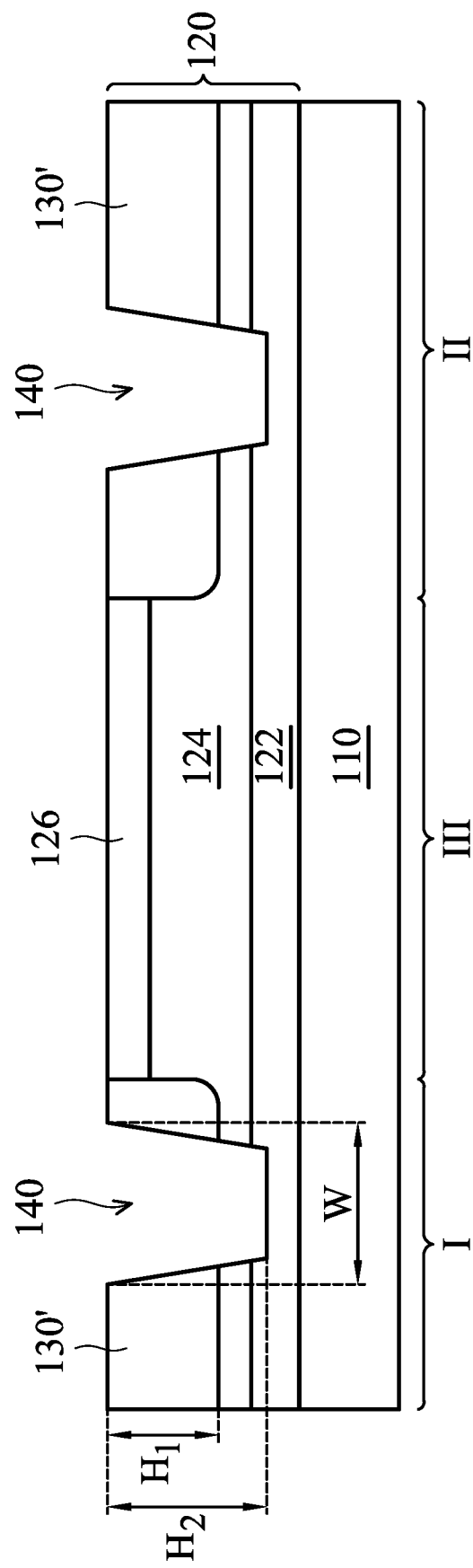
FIG. 1C shows a cross-sectional view of a semiconductor device at various manufacturing stages according to some embodiments of the present disclosure.
Figure 1D:
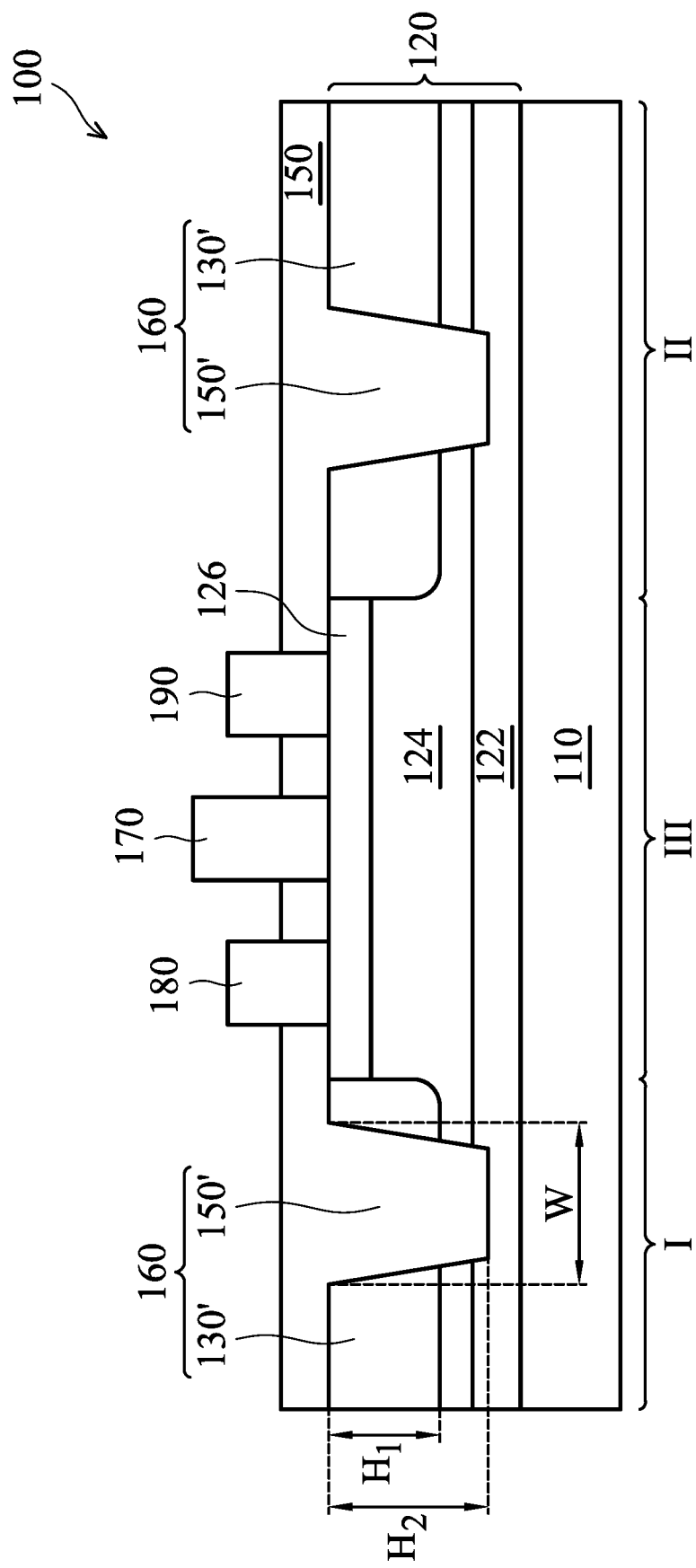
FIG. 1D shows a cross-sectional view of a semiconductor device at various manufacturing stages according to some embodiments of the present disclosure.

Referring to FIG. 1D, it shows a cross-sectional view of a semiconductor device 100 according to an embodiment of the present disclosure. The semiconductor device 100 includes a substrate 110. An epitaxial layer 120 is disposed on the substrate 100, and the epitaxial layer 120 has insulation regions I, II and an active region III. An insulation structure 160 is disposed within the insulation regions I, II. A gate 170 is disposed on the epitaxial layer 120 and within the active region III. A source 180 and a drain 190 are disposed on opposite sides of the gate 170 and within the active region III. Each of the above components and the process for the formation thereof will be discussed in more detail in the following paragraphs.

In some embodiments, the substrate 110 may include a sapphire substrate, a silicon substrate, or a silicon carbide substrate. In some embodiments, the substrate 110 may include a semiconductor material, an insulator material, a conductor material, or one or more layers composed of a combination thereof. For example, the substrate 110 may be selected from at least one semiconductor material selected from a group consisting of Si, Ge, SiGe, GaP, GaAs, SiC, SiGeC, InAs, and InP. In another embodiment, the substrate 110 may also include a silicon on insulator (SOI). In another embodiment, the substrate 110 may also be composed of a multi-layered material, for example, Si/SiGe and Si/SiC. In another embodiment, the substrate 110 may include an insulator material, for example, an organic insulator, an inorganic insulator, or one or more layers composed of a combination thereof. In another embodiment, the substrate 110 may also include a conductive material, for example, polysilicon, metal, alloy, or one or more layers composed of a combination thereof.

The epitaxial layer 120 may include a buffer layer 122 disposed on the substrate 110, a first III-V compound layer 124 disposed on the buffer layer 122, and a second III-V compound layer 126 disposed on the first III-V compound layer 124.

The function of the buffer layer 122 is to reduce the strain generated by the substrate 110 and the III-V compound layer formed thereafter. The buffer layer 122 may be an aluminum nitride (AlN) layer, for example. The lattice differences and the coefficient of thermal expansion of the AlN crystal nucleus layer and the substrate 110 are small, and thus the strain generated between the substrate 110 and the III-V compound layer formed thereafter is reduced. In some embodiments, the buffer layer 122 may have a thickness ranging between about 10 nm and about 3000 nm.

The first III-V compound layer 124 and the second III-V compound layer 126 are composed of compounds made from the III-V elements in the periodic table. However, the first III-V compound layer 124 and the second III-V compound layer 126 are different from each other in composition. The first III-V compound layer 124 and the second III-V compound layer 126 directly contact each other. In one embodiment, the first III-V compound layer 124 includes a gallium nitride (GaN) layer. In one embodiment, the second III-V compound layer 126 includes an aluminum gallium nitride ($Al_xGa_{1-x}N$) layer, wherein 0<x<1.

The first III-V compound layer 124 may be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemicals. In one embodiment, the first III-V compound layer 124 may have a thickness ranging between about 0.2 μm and about 10 μm.

The second III-V compound layer 126 may be epitaxially grown by MOVPE using aluminum-containing precursor, gallium-containing precursor, and nitrogen-containing precursor. The aluminum-containing precursor includes trimethylaluminum (TMA), triethylaluminum (TEA), or other suitable chemicals. The gallium-containing precursor includes trimethylgallium (TMG), triethylgallium (TEG), or other suitable chemicals. The nitrogen-containing precursor includes ammonia ($NH_3$), tert-butylamine (TBAm), phenyl hydrazine, or other suitable chemicals. In one embodiment, the second III-V compound layer 126 may have a thickness ranging between about 1 nm and about 100 nm. The composition ratio of aluminum and the thickness of the second III-V compound layer 126 can be adjusted according to the actual requirement to substantially control the critical voltage of the element.

The insulation structure 160, including a first insulation structure 130' and a second insulation structure 150', is disposed within the insulation regions I, II. The first insulation structure 130' and the second insulation structure 150' are different from each other in composition. The area where the insulation structure 160 is formed is defined as the insulation regions I and II. In FIG. 1D, the width of insulation region I is less than the width of insulation region II; however, in other embodiments, insulation region I and insulation region II may have the same or different widths according to actual demands.

In some embodiments, the first insulation structure 130' may include ion-doped III-V compounds. The III-V compounds are composed of compounds made from the III-V elements in the periodic table. In some embodiments, the II-V compounds for constituting the first insulation structure 130' is the same as the III-V compounds for constituting the first III-V compound layer 124 and the second III-V compound layer 126. The difference is that the III-V compounds for constituting the first insulation structure 130' are further doped with ions. In some embodiments, the first insulation structure 130' may include ion-doped gallium nitride and ion-doped aluminum gallium nitride. The dopants of the first insulation structure 130' may include oxygen (O), nitrogen (N), argon (Ar), silicon (Si), hydrogen (H), helium (He), fluorine (F), magnesium (Mg), or zinc (Zn). The dopants may have a concentration ranging between about $10^{10}$ cm$^{-3}$ and about $10^{18}$ cm$^{-3}$.

In some embodiments, the first insulation structure 130' may have a depth $H_1$ ranging between about 1 nm and about 15 μm. In some embodiments, the first insulation structure 130' is at least disposed within a part of the epitaxial layer 120. For example, in one embodiment, the first insulation structure 130' is disposed within the second III-V compound layer 126 and a part of the first III-V compound layer 124. In another embodiment, the first insulation structure 130' is disposed within the second III-V compound layer 126 and the first III-V compound layer 124. In such cases, the depth $H_1$ is approximately equal to the sum of the thicknesses of the second III-V compound layer 126 and the first III-V compound layer 124. In another embodiment, the first insulation structure 130' is disposed within the entire epitaxial layer 120, i.e., the first insulation structure 130' is disposed within the second III-V compound layer 126, the first III-V compound layer 124, and the buffer layer 122. In such cases, the depth $H_1$ is approximately equal to the sum of the thickness of the second III-V compound layer 126, the first III-V compound layer 124, and the buffer layer 122. In another embodiment, the first insulation structure 130' may further extend to a part of the substrate 110 or the entire of the substrate 110.

In some embodiments, the second insulation structure 150' may include dielectric materials. The dielectric materials may include such as silicon oxide ($SiO_2$), silicon nitride ($Si_3N_4$), silicon oxynitride (SiON), tantalum oxide ($Ta_2O_5$), titanium oxide ($TiO_2$), zinc oxide ($ZnO_2$), zirconium oxide ($ZrO_2$), aluminum oxide ($Al_2O_3$), hafnium oxide ($HfO_2$), aluminum nitride silicon ($AlSiN_3$), silicon oxide hafnium (HfSiO), hafnium silicon oxynitride (HfSiON), hafnium tantalum oxide (HMO), hafnium titanium oxide (HMO), hafnium zirconium oxide (HfZrO), silicon carbide (SiC), or a combination thereof. In some embodiments, the second insulation structure 150' may have a depth $H_2$ ranging between 0.1 μm and about 15 μm. In some embodiments, the second insulation structure 150' is at least disposed within a part of the epitaxial layer 120. For example, in one embodiment, the second insulation structure 150' is disposed within the second III-V compound layer 126 and a part of the first III-V compound layer 124. In another embodiment, the second insulation structure 150' is disposed within the second III-V compound layer 126 and the first III-V compound layer 124. In such cases, the depth $H_2$ is approximately equal to the sum of the thickness of the second III-V compound layer 126 and the first III-V compound layer 124. In another embodiment, the second insulation structure 150' is disposed within the entire epitaxial layer 120, i.e., the second insulation structure 150' is disposed within the second III-V compound layer 126, the first III-V compound layer 124, and the buffer layer 122. In such cases, the depth $H_2$ is approximately equal to the sum of the thickness of the second III-V compound layer 126, the first III-V compound layer 124, and the buffer layer 122. In another embodiment, the second insulation structure 150' may further extend to a part of the substrate 110 or the entire of the substrate 110.

As shown in FIG. 1D, in the embodiments of the present disclosure, the first insulation structure 130' and the second insulation structure 150' are partially overlapped. It should be noted that the insulation structure 160 composed of the first insulation structure 130' and the second insulation structure 150' provides a double isolation effect to the conduction of the adjacent elements. When merely using the first insulation structure 130' formed by an ion implantation, the sheet resistivity of the first insulation structure 130' will deteriorate at high temperatures, resulting in a poor isolation effect. In the present disclosure, the existence of the second insulation structure 150' can compensate for the aforementioned drawbacks of the first insulating structure 130'. Therefore, using the insulation structure 160 provides a better isolation effect at high temperatures than merely using the first insulation structure 130'. When merely using the second insulation structure 150' formed by an etching process, since the material damage caused by the etching process generates additional leakage current path, the isolation effect becomes poor. In the present disclosure, the first insulation structure 130' is formed around the sidewall of the second insulation structure 150', compensating for the aforementioned drawbacks of the second insulating structure 150'. Therefore, using the insulation structure 160 provides a lower leakage current and a better isolation effect than merely using the second insulation structure 150'.

In the embodiments of the present disclosure, the relationship between the depth $H_1$ of the first insulation structure 130' and the depth $H_2$ of the second insulation structure 150' is not specifically limited. As long as the first insulation structure 130' and the second insulation structure 150' collectively form the insulation structure 160 and block the 2-DEG existing between the first III-V compound layer 124 and the second III-V compound layer 126, the drawbacks thereof can be compensated and the isolation effect can be improved. Although FIG. 1D only illustrates a structure in which a depth $H_1$ of the first insulation structure 130' is less than the depth $H_2$ of the second insulation structure 150', it can be realized that the depth $H_1$ of the first insulation structure 130' may be greater than or equal to the depth $H_2$ of the second insulation structure 150' in other embodiments. As long as the sidewall of the second insulation structure 150' is partially or entirely surrounded by the first insulation structure 130', the leakage current path generated on the sidewall of the second insulation structure 150' can be blocked. When the sidewall of the second insulation structure 150' is entirely surrounded by the first insulation structure 130', the effect of inhibiting the leakage current is better.

In addition, in the embodiments of the present disclosure, the width W of the top portion of the second insulation structure 150' is less than the width of the insulation region I or the width of the insulation region II. If the width W of the top portion of the second insulation structure 150' is too large, the sidewall of the second insulation structure 150' cannot be surrounded by the first insulation structure 130', and thus the effect of inhibiting the leakage current provided by the insulation structure 160 becomes poor.

As shown in FIG. 1D, in some embodiments, the semiconductor device 100 further includes a dielectric layer 150 disposed on the buffer layer 126, the first insulation structure 130', and the second insulation structure 150'. The material of the dielectric layer 150 may include silicon oxide ($SiO_2$), silicon nitride ($Si_3N_4$), silicon oxynitride (SiON), tantalum oxide ($Ta_2O_5$), titanium oxide ($TiO_2$), zinc oxide ($ZnO_2$), zirconium oxide ($ZrO_2$), aluminum oxide ($Al_2O_3$), hafnium oxide ($HfO_2$), aluminum nitride silicon ($AlSiN_3$), silicon oxide hafnium (HfSiO), hafnium silicon oxynitride (Hf- SiON), hafnium tantalum oxide (HfTaO), hafnium titanium oxide (HMO), hafnium zirconium oxide (HfZrO), silicon carbide (SiC), or a combination thereof. In one embodiment, the dielectric layer 150 and the second insulation structure 150' may be formed in the same deposition process. In such cases, the material of the dielectric layer 150 and the material of the second insulation structure 150' may be the same, and the second insulation structure 150' is a part of the dielectric layer 150, as shown in FIG. 1D. In another embodiment, the dielectric layer 150 may be formed in another deposition process after the formation of the second insulation structure 150'. In such cases, the material of the dielectric layer 150 and the material of the second insulation structure 150' may be the same or different, and each of the dielectric layer 150 and the second insulation structure 150' is an individual structure. In some embodiments, the dielectric layer 150 may have a thickness ranging between about 1 nm and about 1000 nm.

FIGS. 1A-1D show a serial of the cross-sectional views of the semiconductor device 100 at various manufacturing stages according to some embodiments of the present disclosure.

Referring to FIG. 1A, at first, a substrate 110 is provided. An epitaxial layer 120 is then formed on the substrate 110. The epitaxial layer 120 may be formed by metal organic chemical vapor deposition (MOCVD). In some embodiments, the step of forming the epitaxial layer 120 may include forming a buffer layer 122 on the substrate 110, forming a first III-V compound layer 124 on the buffer layer 122, and forming a second III-V compound layer 126 on the first III-V compound layer 124. The materials of the substrate 110 and the epitaxial layer 120 are described in the related paragraphs above, and hence are not described again to avoid unnecessary repetition.

Next, the insulation regions I, II and the active region III are defined on the upper surface of the epitaxial layer 120. Referring to FIG. 1B, an ion implantation process is performed to form an ion-doped region 130. The area where the ion implantation process is performed forms the insulation regions I and II. In some embodiments, the dopants used in the ion implantation process may include oxygen (O), nitrogen (N), argon (Ar), silicon (Si), hydrogen (H), helium (He), fluorine (F), magnesium (Mg), or zinc (Zn). In some embodiments, the dopants of the ion implantation may have a concentration ranging between about $10^{10}$ cm$^{-3}$ and about $10^{18}$ cm$^{-3}$. As shown in FIG. 1B, the ion-doped region 130 has a depth $H_1$. In some embodiments, the ion-doped region 130 is at least disposed within a part of the epitaxial layer 120. In one embodiment, the ion-doped region 130 is disposed within the second III-V compound layer 126 and a part of the first III-V compound layer 124. In another embodiment, the ion-doped region 130 is disposed within the second III-V compound layer 126 and the first III-V compound layer 124. In such cases, the depth $H_1$ is approximately equal to the sum of the thickness of the second III-V compound layer 126 and the first III-V compound layer 124. In another embodiment, the ion-doped region 130 may be disposed within the entire epitaxial layer 120, i.e., the ion-doped region 130 is disposed within the second III-V compound layer 126, the first III-V compound layer 124, and the buffer layer 122. In such cases, the depth $H_1$ is approximately equal to the sum of thickness of the second III-V compound layer 126, the first III-V compound layer 124, and the buffer layer 122. In another embodiment, the ion-doped region 130 may further extend to a part of the substrate 110 or the entire of the substrate 110.

Next, referring to FIG. 1C, an opening 140 is formed within the ion-doped region 130 by an etching process. The etching process may be, for example, a mesa etching, a dry etching, or other suitable etching processes. A shown in FIG. 1C, the opening 140 has a depth $H_2$, and the top portion of the opening 140 has a width W. In some embodiments, the width W of the top portion of the opening 140 is less than the area where the ion implantation is performed and the area of insulation region I or insulation region II. In some embodiments, the opening 140 passes through the ion-doped region 130 and at least extends downward to the un-doped portion of the epitaxial layer 120. After the etching process, the remaining portion of the ion-doped region 130 forms a first insulation structure 130'. In one embodiment, the opening 140 passes through the ion-doped region 130 and extends to the un-doped portion of the first III-V compound layer 124. In such cases, the depth $H_2$ is approximately equal to the sum of the thickness of the second III-V compound layer 126 and the first III-V compound layer 124. In another embodiment, the opening 140 passes through the ion-doped region 130 and extends to the un-doped portion of the first III-V compound layer 124 and the buffer layer 122. In such cases, the depth $H_2$ is approximately equal to the sum of the thickness of the second III-V compound layer 126, the first III-V compound layer 124, and the buffer layer 122. In another embodiment, the opening 140 passes through the ion-doped region 130 and extends to the un-doped portion of the first III-V compound layer 124, the buffer layer 122, and a part of or the substrate 110 or the entire of the substrate 110.

Next, referring to FIG. 1D, the dielectric layer 150 may be formed by metal organic chemical vapor deposition (MOCVD), chemical vapor deposition (CVD), physical vapor deposition (PVD), atomic layer deposition (atomic Layer deposition, ALD), thermal oxidation, or other suitable deposition processes. In some embodiments, the dielectric layer 150 may be formed by a single deposition process. In such cases, the dielectric layer 150 disposed within the opening 140 is defined as the second insulation structure 150'. In this embodiment, the second insulation structure 150' is a part of the dielectric layer 150. In other embodiments, a second insulation structure 150' may firstly be formed within the opening 140 by such as a deposition process and a planarization process, and the dielectric layer 150 may then be formed by another deposition process. In this embodiment, each of the dielectric layer 150 and the second insulation structure 150' is an individual structure. With the same size as the opening 140, the second insulation structure 150' has a depth $H_2$, and the top portion of the second insulation structure 150' has a width W. The dielectric layer 150 may have a thickness ranging between about 1 nm and about 1000 nm above the epitaxial layer 120. At this step, the first insulation structure 130' and the second insulation structure 150' form the insulation structure 160.

As mentioned above, the relationship between the depth $H_1$ of the first insulation structure 130 and the depth $H_2$ of the second insulation structure is not specifically limited. As long as the first insulation structure 130' and the second insulation structure 150' collectively form the insulation structure 160 and block the 2-DEG existing between the first III-V compound layer 124 and the second III-V compound layer 126, the drawbacks thereof can be compensated and the isolation effect can be improved. Although FIG. 1D only illustrates a structure in which a depth $H_1$ of the first insulation structure 130' is less than the depth $H_2$ of the second insulation structure 150', it can be realized that the depth $H_1$ of the first insulation structure 130' may be greater than or equal to the depth $H_2$ of the second insulation structure 150' in other embodiments. As long as the sidewall of the second insulation structure 150' is partially or entirely surrounded by the first insulation structure 130', the leakage current path generated on the sidewall of the second insulation structure 150' can be blocked. When the sidewall of the second insulation structure 150' is entirely surrounded by the first insulation structure 130', the effect of inhibiting the leakage current is better.

Subsequently, a part of the dielectric layer 150 within the active region III may be removed by a photolithography patterning process and an etching process to form the opening of the dielectric layer 150 and expose a part of the second III-V compound layer 126. Next, a gate 170 may be formed within the opening of the dielectric layer 150 and a source 180 and a drain 190 may be formed on opposite sides of the gate 170 by CVD, PVD, ALD, coating, sputtering, or other suitable deposition processes, lithographic patterning processes, and etching processes. At this step, the semiconductor device 100 according to one embodiment of the present disclosure is accomplished.

Figure 2A:
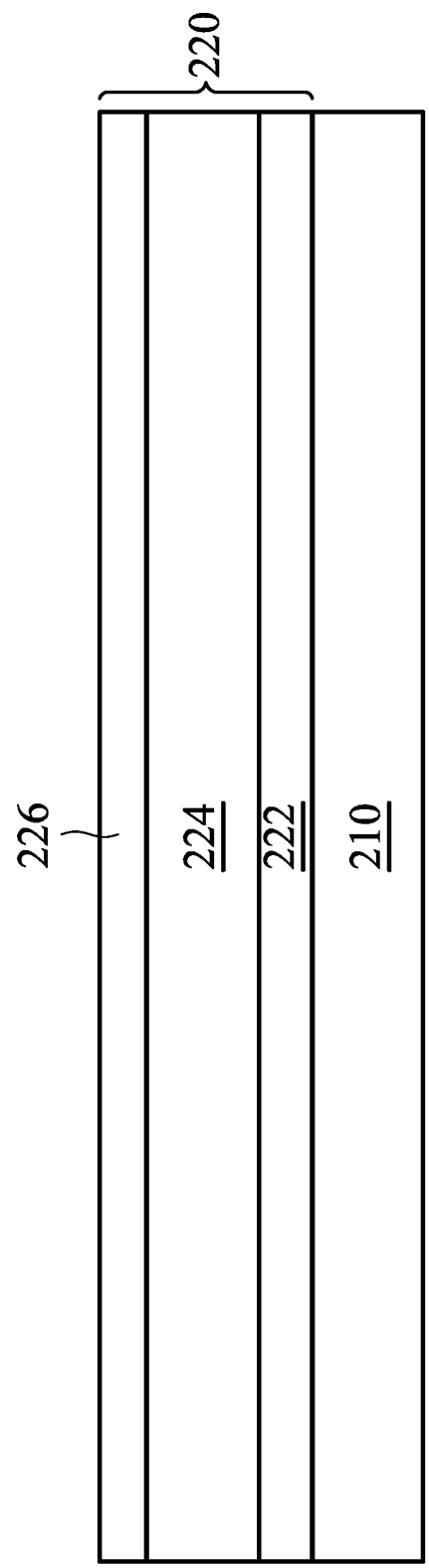
FIG. 2A shows a cross-sectional view of a semiconductor device at various manufacturing stages according to some embodiments of the present disclosure.
Figure 2B:
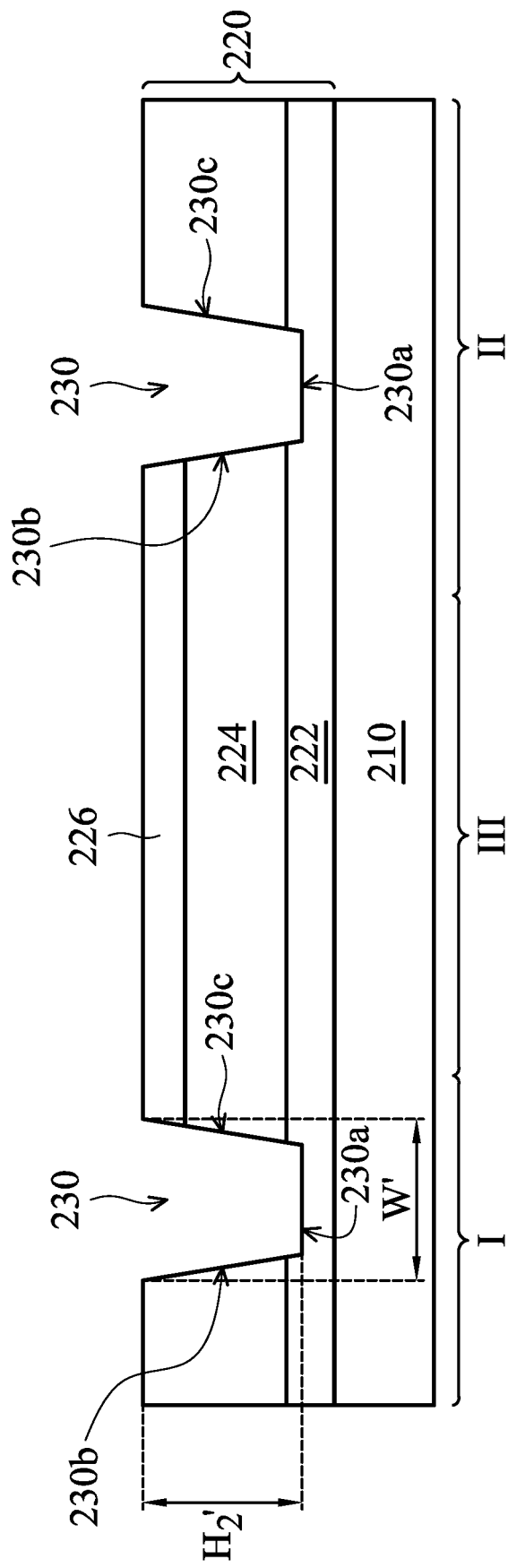
FIG. 2B shows a cross-sectional view of a semiconductor device at various manufacturing stages according to some embodiments of the present disclosure.
Figure 2C:
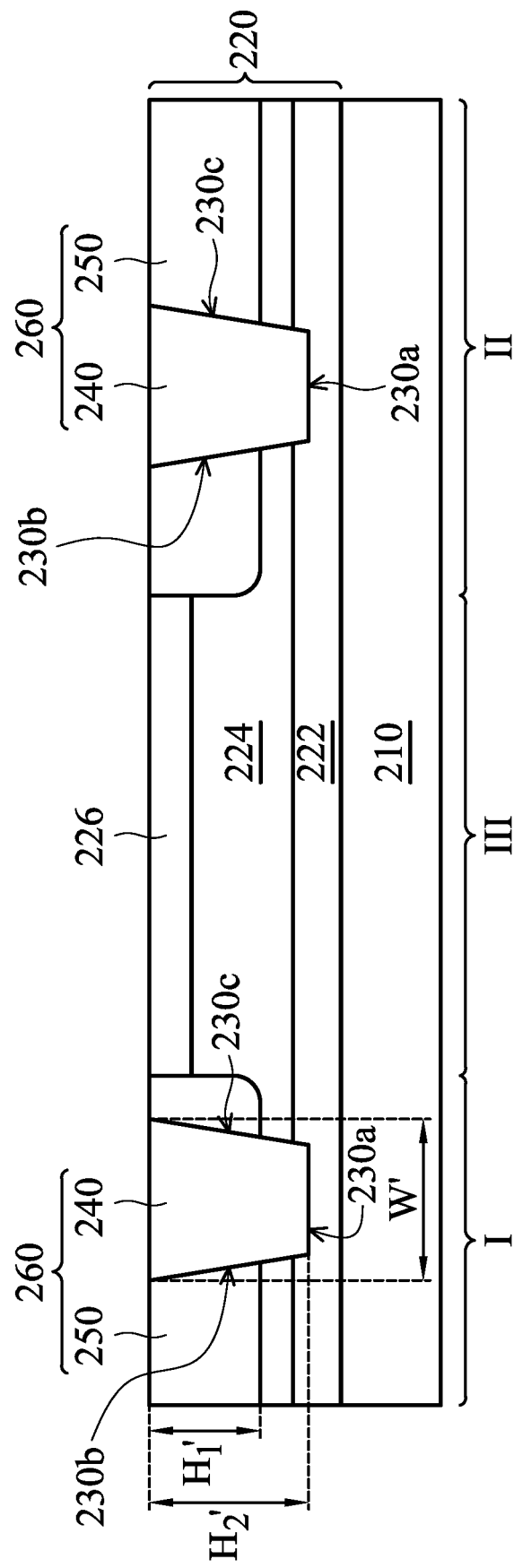
FIG. 2C shows a cross-sectional view of a semiconductor device at various manufacturing stages according to some embodiments of the present disclosure.
Figure 2D:
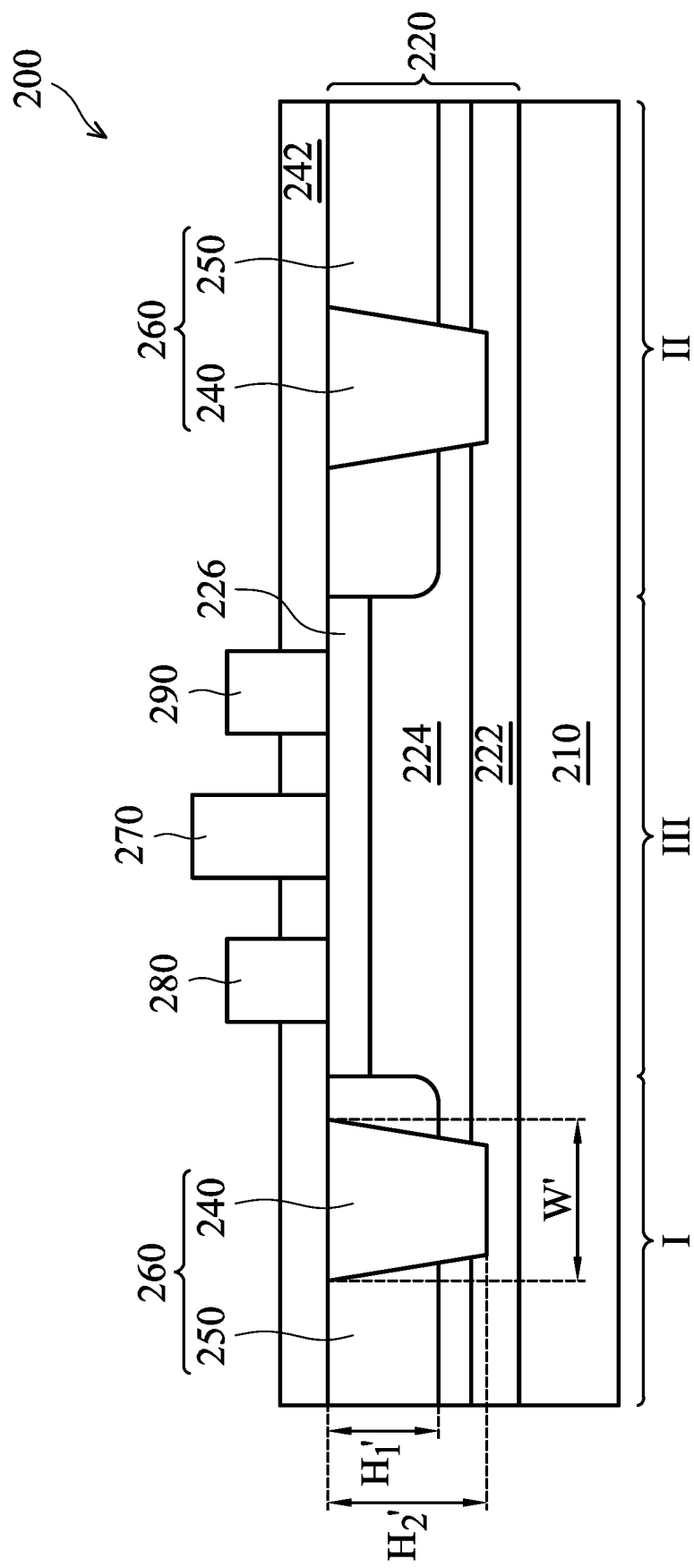
FIG. 2D shows a cross-sectional view of a semiconductor device at various manufacturing stages according to some embodiments of the present disclosure.

Next, referring to FIG. 2D, it shows a cross-sectional view of the semiconductor device 200 according to another embodiment of the present disclosure. The semiconductor device 200 is similar in structure to the semiconductor device 100, the difference is that the dielectric layer 242 of the semiconductor device 200 is formed after the formation of the second insulation structure 240, and each of the dielectric layer 242 and the second insulation structure 240 is an individual structure.

FIGS. 2A-2D show a serial cross-sectional views of the semiconductor device 200 at various stages according to some embodiments of the present disclosure.

Referring to FIG. 2A, as first, a substrate 210 is provided. An epitaxial layer 220 is formed on the substrate 210. The epitaxial layer 220 may be formed by metal organic vapor phase epitaxy (MOVPE). In some embodiments, the step of forming the epitaxial layer 220 may include forming a buffer layer 222 on the substrate 210, forming a first III-V compound layer 224 on the buffer layer 222, and forming a second III-V compound layer 226 on the first III-V compound layer 224. The materials of the substrate 210 and the epitaxial layer 220 are described in the related paragraphs above, and hence are not described again to avoid unnecessary repetition. Next, the insulation regions I, II and the active region III are defined on an upper surface of the epitaxial layer 220.

Next, referring to FIG. 2B, an opening 230 is formed within the epitaxial layer 220 by an etching process. The etching process may be, for example, a mesa etching, a dry etching, or other suitable etching processes. As shown in FIG. 2B, the opening 230 has a depth $H_2'$, and the top portion of the opening 230 has a width W'. In some embodiments, the opening 230 passes through at least a part of the epitaxial layer 220. In one embodiment, the opening 230 passes through the second III-V compound layer 226 and a part of the first III-V compound layer 224. In another embodiment, the opening 230 passes through the second III-V compound layer 226 and the first III-V compound layer 224. In such cases, the depth $H_2'$ is approximately equal to the sum of the thicknesses of the second III-V compound layer 226 and the first III-V compound layer 224. In another embodiment, the opening 230 passes through the entire of the epitaxial layer 220, i.e., the opening 230 passes through the second III-V compound layer 226, the first III-V compound layer 224, and the buffer layer 222. In such cases, the depth $H_2'$ is approximately equal to the sum of the thicknesses of the second III-V compound layer 226, the first III-V compound layer 224, and the buffer layer 222. In another embodiment, the opening 230 may further pass through a part of the substrate 210 or the entire of the substrate 210.

Next, referring to FIG. 2C, a second insulation structure 240 is formed. Dielectric materials may be deposited by metal organic chemical vapor deposition (MOCVD), chemical vapor deposition (CVD), physical vapor deposition (PVD), atomic layer deposition (atomic Layer deposition, ALD), thermal oxidation, or other suitable deposition processes. Then, a planarization process such as a chemical-mechanical planarization (CMP) process or a dry etching process is performed to remove the extra dielectric material until the second III-V compound layer 226 is exposed, thereby forming a second insulation structure 240. With the same size as the opening 230, the second insulation structure 240 has a depth $H_2'$, and the top portion of the second insulation structure 240 has a width W'.

Afterwards, an ion implantation process is performed to form a first insulation structure 250. The area where the ion implantation process is performed is equal to the area of insulation region I or insulation region II, and is greater than the width W' of the top portion of the second insulation structure 240. In some embodiments, the dopants used in the ion implantation process may include oxygen (O), nitrogen (N), argon (Ar), silicon (Si), hydrogen (H), helium (He), fluorine (F), magnesium (Mg), or zinc (Zn). In some embodiments, the dopants of the ion implantation process may have a concentration ranging between about $10^{10}$ cm$^{-3}$ and about $10^{18}$ cm$^{-3}$. As shown in FIG. 2C, the first insulation structure 250 has a depth $H_1'$. In some embodiments, the first insulation structure 250 is at least disposed within a part of the epitaxial layer 220. In an embodiment, the first insulation structure 250 is disposed within the second III-V compound layer 226 and a part of the first III-V compound layer 224. In another embodiment, the first insulation structure 250 is disposed within the second III-V compound layer 226 and the first III-V compound layer 224. In such cases, the depth $H_1'$ is approximately equal to the sum of the thickness of the second III-V compound layer 226 and the first III-V compound layer 224. In another embodiment, the first insulation structure 250 may be disposed within the entire epitaxial layer 220, i.e., the first insulation structure 250 is disposed within the second III-V compound layer 226, the first III-V compound layer 224, and the buffer layer 222. In such cases, the depth $H_1'$ is approximately equal to the sum of the thickness of the second III-V compound layer 226, the first III-V compound layer 224, and the buffer layer 222. In another embodiment, the first insulation structure 250 may further extend to a part of the substrate 210 or the entire of the substrate 210. At this step, the first insulation structure 250 and the second insulation structure 240 form the insulation structure 260.

In should be noted that, in the process for forming the semiconductor device 200, the ion implantation process is performed after the formation of the second insulation structure 240. Since the width of the top portion of the second insulation structure 240 is greater than the width of the bottom edge 230a of the second insulation structure 240, the underlying material layer may be blocked and cannot be doped. In order to avoid this condition, in the present embodiment, the direction of the ion implantation process may have an inclination angle with respect to the horizontal direction. The inclination angle may be the same as the angle of the side edges 230b and 230c of the second insulation structure 240. As a result, the first insulation structure 250 in the present embodiment can be uniformly doped.

Similarly, the relationship between the depth $H_1'$ of the first insulation structure 250 and the depth $H_2'$ of the second insulation structure 240 is not specifically limited. As long as the first insulation structure 250 and the second insulation structure 240 collectively form the insulation structure 260 and block the 2-DEG existing between the first III-V compound layer 224 and the second III-V compound layer 226, the drawbacks thereof can be compensated and the isolation effect can be improved. Although FIG. 2D only illustrates a structure in which a depth $H_1'$ of the first insulation structure 250 is less than the depth $H_2'$ of the second insulation structure 240, it can be realized that the depth $H_1'$ of the first insulation structure 250 may be greater than or equal to the depth $H_2'$ of the second insulation structure 240 in other embodiments. As long as the sidewall of the second insulation structure 240 is partially or entirely surrounded by the first insulation structure 250, the leakage current path generated on the sidewall of the second insulation structure 240 can be blocked. When the sidewall of the second insulation structure 240 is entirely surrounded by the first insulation structure 250, the effect of inhibiting the leakage current is better.

Next, referring to FIG. 2D, the dielectric layer 242 may be formed on the epitaxial layer 220 by metal organic chemical vapor deposition (MOCVD), chemical vapor deposition (CVD), physical vapor deposition (PVD), atomic layer deposition (atomic Layer deposition, ALD), thermal oxidation, or other suitable deposition processes. In some embodiments, the dielectric layer 242 may have a thickness ranging between about 1 nm and about 1000 nm.

Then, a part of the dielectric layer 242 within the active region III may be removed by using a photolithography patterning process and an etching process to form an opening of the dielectric layer 242, thereby exposing a part of the second III-V compound layer 226. Next, a gate 270 may be formed within the opening of the dielectric layer 242, and a source 280 and a drain 290 may be form on opposite sides of the gate 270 by CVD, PVD, ALD, coating, sputtering, or other suitable deposition processes, photolithography pattering processes, and etching processes. At this step, the semiconductor device 200 according to an embodiment of the present disclosure is accomplished.

By providing an improvement of the process, the embodiments of the present disclosure forms an insulation region with a good isolation effect in semiconductor devices by using a double insulation process, thereby blocking conduction between adjacent elements. By performing the double isolation process (the ion implantation process and the etching process), the semiconductor devices 100 and 200 provided the present disclosure have an insulation structure composed of a first insulation structure and a second insulation structure. The different compositions of the first insulation structure and the second insulation structure provide a double isolation effect for the conduction between the adjacent elements. Compared to the semiconductors formed by the current technology, the problems of the deteriorated sheet resistivity of the insulation region at high temperatures is improved and the leakage current path generated during the process is avoided in the present disclosure. Therefore, the semiconductor devices 100 and 200 provided by the present disclosure have a lower leakage current and a better isolation effect even at high temperatures.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a substrate;
   forming an epitaxial layer on the substrate;
   defining an insulation region and an active region on an upper surface of the epitaxial layer;
   forming an insulation structure within the insulation region by an ion implantation process and an etching process, wherein the insulation structure comprises a first insulation structure and a second insulation structure, the first insulation structure and the second insulation structure are different from each other in composition, and the first insulation structure comprises an ion-doped III-V compound;
   forming a gate on the epitaxial layer and within the active region; and
   forming a source and a drain on opposite sides of the gate and within the active region.

2. The method for forming a semiconductor device as claimed in claim 1, wherein the substrate comprises a sapphire substrate, a silicon substrate, or a silicon carbide substrate.

3. The method for forming a semiconductor device as claimed in claim 1, wherein the step of forming an epitaxial layer on the substrate comprises:
   forming a buffer layer on the substrate;
   forming a first III-V compound layer on the buffer layer; and
   forming a second III-V compound layer on the first III-V compound layer.

4. The method for forming a semiconductor device as claimed in claim 3, wherein the first III-V compound layer comprises a gallium nitride (GaN) layer.

5. The method for forming a semiconductor device as claimed in claim 3, wherein the second III-V compound layer comprises an aluminum gallium nitride ($Al_xGa_{1-x}N$) layer, wherein 0<x<1.

6. The method for forming a semiconductor device as claimed in claim 3, wherein the step of forming an insulation structure within the insulation region by an ion implantation process and an etching process sequentially comprises:
   performing the ion implantation to form an ion-doped region, wherein the ion-doped region is at least disposed within a part of the epitaxial layer;
   forming an opening within the ion-doped region by the etching process, wherein the opening passes through the ion-doped region and at least extends downward to the un-doped portion of the epitaxial layer, wherein the remaining portion of the ion-doped region forms the first insulation structure; and
   forming the second insulation structure within the opening.

7. The method for forming a semiconductor device as claimed in claim 3, wherein the step of forming an insulation structure within the insulation region by an ion implantation process and an etching process sequentially comprises:
   forming an opening within the epitaxial layer by the etching process, wherein the opening at least passes through a part of the epitaxial layer;
   forming the second insulation structure within the opening; and performing the ion implantation process to form the first insulation structure, wherein the first insulation structure is at least disposed within a part of the epitaxial layer.

8. The method for forming a semiconductor device as claimed in claim 6, wherein the area where the ion implantation process is performed is equal to the area of the insulation region and is greater than the width of the opening.

9. The method for forming a semiconductor device as claimed in claim 6, wherein the opening at least passes through the second III-V compound layer.

10. The method for forming a semiconductor device as claimed in claim 6, wherein the first insulation structure is disposed within the second III-V compound layer and a part of the first III-V compound layer.

11. The method for forming a semiconductor device as claimed in claim 1, wherein the depth of the first insulation structure and the depth of the second insulation structure respectively range between 0.1 µm and 15 µm.

12. A semiconductor device, comprising:
a substrate;
an epitaxial layer, disposed on the substrate, wherein the epitaxial layer has an insulation region and an active region;
an insulation structure, comprising a first insulation structure and a second insulation structure, disposed within the insulation region;
a gate, disposed on the epitaxial layer and within the active region; and
a source and a drain, disposed on opposite sides of the gate and within the active region;
wherein the first insulation structure and the second insulation structure are different from each other in composition, and the first insulation structure comprises an ion-doped III-V compound.

13. The semiconductor device as claimed in claim 12, wherein the second insulation structure comprises a dielectric material.

14. The semiconductor device as claimed in claim 12, wherein the depth of the first insulation structure and the depth of the second insulation structure respectively range between 0.1 µm and 15 µm.

15. The semiconductor device as claimed in claim 12, wherein the epitaxial layer comprises:
a buffer layer, disposed on the substrate;
a first III-V compound layer, disposed on the buffer layer; and
a second III-V compound layer, disposed on the first III-V compound layer.

16. The semiconductor device as claimed in claim 15, wherein the first III-V compound layer comprises a gallium nitride (GaN) layer.

17. The semiconductor device as claimed in claim 15, wherein the second III-V compound layer comprises an aluminum gallium nitride (Al$_x$Ga1-xN) layer, wherein 0<x<1.

18. The semiconductor device as claimed in claim 15, wherein the first insulation structure and the second insulation structure are at least disposed within the second III-V compound layer and a part of the first III-V compound layer.

19. The semiconductor device as claimed in claim 12, wherein the substrate comprises a sapphire substrate, a silicon substrate, or a silicon carbide substrate.

* * * * *